(12) United States Patent
Suzuki et al.

(10) Patent No.: US 7,138,867 B2
(45) Date of Patent: Nov. 21, 2006

(54) BALANCED VARIABLE GAIN AMPLIFIER CAPABLE OF ACHIEVING PERFORMANCE BY LOW SOURCE VOLTAGE

(75) Inventors: Takeo Suzuki, Fukushima-ken (JP); Akira Asao, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 149 days.

(21) Appl. No.: 10/913,612

(22) Filed: Aug. 6, 2004

(65) Prior Publication Data

US 2005/0030096 A1 Feb. 10, 2005

(30) Foreign Application Priority Data

Aug. 8, 2003 (JP) .............................. 2003-290953

(51) Int. Cl.
*H03F 3/45* (2006.01)
(52) U.S. Cl. ..................................... 330/254
(58) Field of Classification Search ................ 330/254, 330/283; 327/359
See application file for complete search history.

(56) References Cited

U.S. PATENT DOCUMENTS 4,528,516 A * 7/1985 Hill, III ...................... 330/254

6,529,075 B1 * 3/2003 Bruck et al. ................ 330/252

FOREIGN PATENT DOCUMENTS

| JP | 2001-007667 | 12/2001 |
| JP | 2001-358546 | 12/2001 |

* cited by examiner

*Primary Examiner*—Steven J. Mottola
(74) *Attorney, Agent, or Firm*—Brinks Hofer Gilson & Lione

(57) ABSTRACT

A balanced gain control amplifier contains first and second transistors differentially connected to each other and having their emitters connected to a first current source. The balanced gain control amplifier also contains third and fourth transistors differentially connected to each other and having their emitters connected to a second constant current source. The collectors of the first and fourth transistors are connected to a power terminal through a common first load resistor, and the collectors of the second and third transistors are connected to the power terminal through a common second load resistor. A signal may be input between the bases of the first and third transistors and the bases of the second and fourth transistors. The current of the second constant current source is variable in a range no more than the current value of the first constant current source.

9 Claims, 3 Drawing Sheets

BALANCED VARIABLE GAIN AMPLIFIER CAPABLE OF ACHIEVING PERFORMANCE BY LOW SOURCE VOLTAGE

This application claims the benefit of Japanese Patent Application No.: 2003-290953, which was filed on Aug. 8, 2003, and is hereby incorporated by reference.

FIELD OF THE INVENTION

The present application relates to a balanced gain control amplifier.

BACKGROUND

FIG. 6 illustrates a conventional gain control amplifier using a Gilbert cell. A differential amplifying circuit 21 includes a first transistor 21a and a second transistor 21b. The emitter of the first transistor 21a and the emitter of the second transistor 21b are connected to each other and a constant current source 22. A first gain control circuit 23 is connected to the collector of the first transistor 21a, and a second gain control circuit 24 is connected to the collector of the second transistor 21b.

The first gain control circuit 23 includes a third transistor 23a and a fourth transistor 23b. The emitters of the third transistor 23a and the fourth transistor 23b are connected to the collector of the first transistor 21a. The collector of one transistor (the third transistor) 23a is connected to a power source through a feeding resistor 23c. The collector of the other transistor (the fourth transistor) 23b is directly connected to the power source.

The second gain control circuit 24 includes a fifth transistor 24a and a sixth transistor 24b. The emitters of the fifth transistor 24a and the sixth transistor 24b are connected to the collector of the second transistor 21b. The collector of one transistor (the fifth transistor) 24a is connected to the power source through a feeding resistor 24c. The collector of the other transistor (the sixth transistor) 24b is directly connected to the power source.

Thus, the differential amplifying circuit 21 and the gain controlling circuits 23 and 24 are connected to the power source in series.

The base of the third transistor 23a of the first gain control circuit 23 and the base of the fifth transistor 24a of the second gain control circuit 24 are connected to each other. Meanwhile, the base of the fourth transistor 23b of the first gain control circuit 23 and the base of the sixth transistor 24b of the second gain control circuit 24 are connected to each other. A gain control voltage (AGC) is applied between a contact point located between the base of the third transistor 23a and the base of the fifth transistor 24a and a contact point between the base of the fourth transistor 23b and the base of the sixth transistor 24b. A signal is balanced-input to a place (IN) between the base of the first transistor 21a and the base of the second transistor 21b. A place (OUT) between the collector of the third transistor 23a and the collector of the fifth transistor 24a is a balanced output terminal (for example, refer to Japanese Unexamined Patent Application Publication No. 2001-7667 (FIGS. 3 and 4)).

In the above structure, when the gain control voltage is changed, the increasing and decreasing direction of the current that flows to each one of transistors (the third transistor 23a and the fifth transistor 24a) of the gain control circuits 23 and 24, is reverse to the increasing and decreasing direction of the current that flows to the other transistors (the fourth transistor 23b and the sixth transistor 24b) of the gain control circuits 23 and 24, such that the level of a signal that is balanced-output to a place between the collector of the third transistor 23a and the collector of the fifth transistor 24a changes.

The above-mentioned gain control amplifier is widely used as a balanced gain control amplifier. However, the differential amplifying circuit and the gain control circuit are connected to the power source in series. Therefore, the voltage supplied to the respective circuits is reduced. Also when the source voltage is low, it is difficult to fully achieve the desired performance of the overall circuit.

SUMMARY

A balanced gain control amplifier capable of operating at a low source voltage is described.

A variable gain amplifier comprises first and second transistors differentially connected to each other and having their emitters connected to a first current source. The variable gain amplifier also comprises third and fourth transistors differentially connected to each other and having their emitters connected to a second constant current source. The collectors of the first and fourth transistors are connected to a power terminal through a common first load resistor, and the collectors of the second and third transistors are connected to the power terminal through a common second load resistor. A signal is input between the bases of the first and third transistors and the bases of the second and fourth transistors. The current of the second constant current source is variable in a range no more than the current value of the first constant current source.

The second constant current source comprises a fifth transistor having its collector connected to the emitters of the third and fourth transistors and its emitter grounded, a sixth transistor having its base and collector connected to each other and to the base of the fifth transistor, wherein the collector is connected to the power terminal by a resistor, and a seventh transistor having its collector connected to the emitter of the sixth transistor and its emitter grounded, wherein a gain control voltage is applied to the base of the seventh transistor.

At least the first to fourth transistors may be constructed in an integrated circuit. The chip sizes of the third and fourth transistors may be smaller than those of the first and second transistors.

The collectors of the first and fourth transistors are connected to the power terminal through the common first load resistor, while the collectors of the second and third transistors are connected to the power terminal through the common second load resistor. A signal is input between the bases of the first and third transistors and the bases of the second and fourth transistors. The current of the second constant current source is variable in a range no more than the current value of the first constant current source. Therefore, all of the voltage of the power terminal is applied between the collectors of the first to fourth transistors and the emitters of the first to fourth transistors excluding a drop in the voltage across the load resistors and across the constant current sources. Therefore, it is possible to construct a variable gain amplifier capable of achieving a sufficient performance even if the voltage of the power terminal is low.

The second constant current source comprises the fifth transistor having its collector connected to the emitters of the third and fourth transistors and its emitter grounded, the sixth transistor having its base and collector connected to each other and to the base of the fifth transistor, wherein the collector is connected to the power terminal by a resistor, and the seventh transistor having its collector connected to the emitter of the sixth transistor and its emitter grounded, wherein a gain control voltage is applied to the base of the seventh transistor, such that the current of the second constant current source can be changed by the gain control voltage.

Also, at least the first to fourth transistors may be constructed in an integrated circuit, and the chip size of the third and fourth transistors may be smaller than that of the first and second transistors, such that it is possible to improve a distortion characteristic.

DETAILED DESCRIPTION

Figure 1:
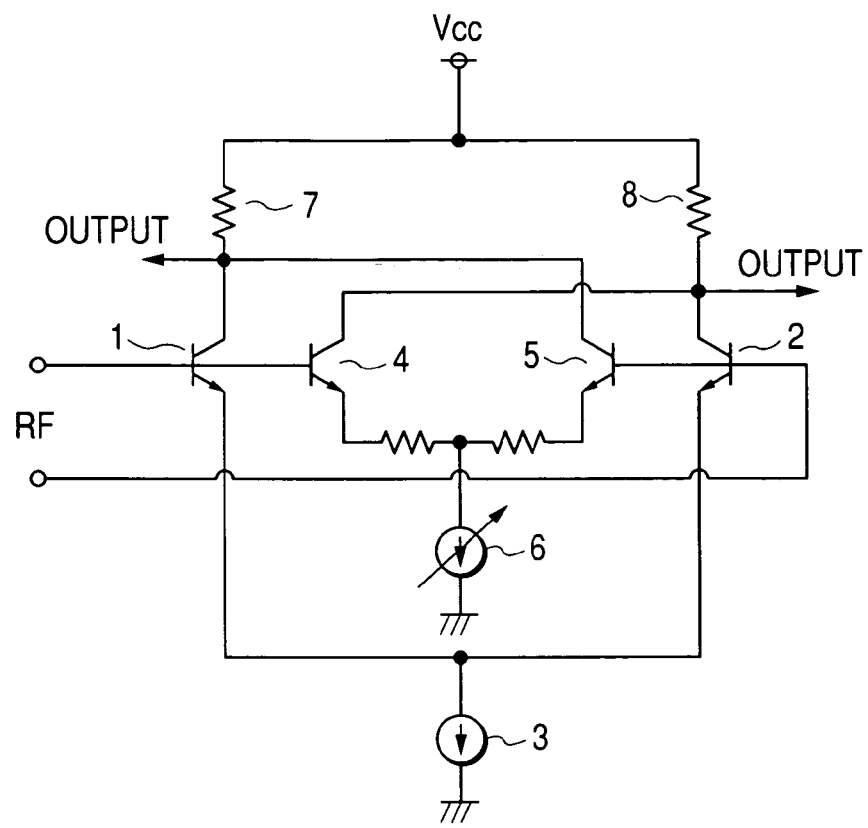
FIG. 1 is a circuit diagram illustrating a structure of a variable gain amplifier.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as set forth by the claims.

A variable gain amplifier will now be described with reference to FIG. 1. The emitters of a first transistor 1 and a second transistor 2 are connected to a first constant current source 3, such that the first transistor 1 and the second transistor 2 are differentially connected to each other. The emitters of a third transistor 4 and a fourth transistor 5 are connected to a second constant current source 6, such that the third transistor 4 and the fourth transistor 5 are differentially connected to each other. The second constant current source 6 is constructed such that the current may be varied.

The collectors of the first transistor 1 and the fourth transistor 5 are connected to a power terminal Vcc through a common first load resistor 7. The collectors of second transistor 2 and the third transistor 4 are connected to the power terminal Vcc through a common second load resistor 8. A signal (IN) is input between the base of the first transistor 1 and the base of the third transistor 4 and the base of the second transistor 2 and the base of the fourth transistor 5.

Figure 2:
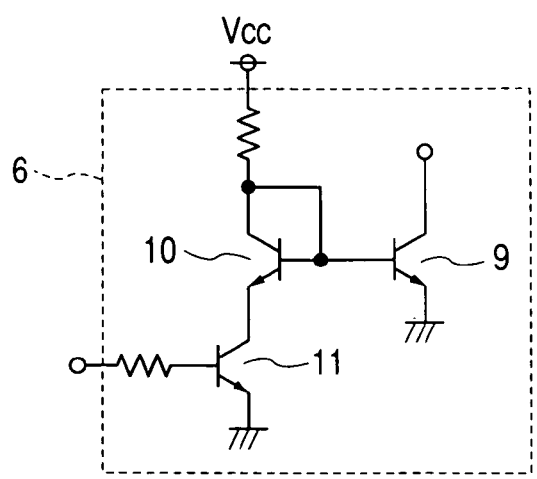
FIG. 2 is a circuit diagram illustrating a structure of a second constant current source in the variable gain amplifier.

FIG. 2 illustrates a structure of the second constant current source 6. The collector of the fifth transistor 9 is connected to the emitters of the third and fourth transistors 4 and 5, and the emitter of the fifth transistor is grounded. The collector and the base of a sixth transistor 10 that may constitute a current mirror circuit together with the fifth transistor 9, are connected to each other and to the base of the fifth transistor 9. The collector of the sixth transistor 10 is connected to the power terminal Vcc through a resistor. The collector of a seventh transistor 11 for changing current is connected to the emitter of the sixth transistor 10 and the emitter of the seventh transistor 11 is grounded. The gain control voltage is applied to the base of the seventh transistor 11.

According to the above-described structure, the phase of an output signal to the collector of the first transistor 1 is reverse to the phase of an output signal to the collector of the fourth transistor 5. The phase of an output signal to the collector of the second transistor 2 is reverse to the phase of an output signal to the collector of the third transistor 4. Therefore, when the current value of the second constant current source 6 is "0", no signal is output to the collectors of the third and fourth transistors 4 and 5, and the maximum output is obtained by the first and second transistors 1 and 2. When the current of the second constant current source 6 is increased to the same value as the current value of the first constant current source 3, the output signals that have phases reverse to each other are offset so that no signal is output to the two load resistors 7 and 8. Hence, the current value of the second constant current source 6 controlled by the gain control voltage performs gain control.

According to the above-described structure, all of the voltage of the power terminal is applied between the collectors of the first to fourth transistors 1, 2, 4, and 5 and the emitters of the first to fourth transistors 1, 2, 4, and 5, excluding a voltage drop across the load resistors 7 and 8 and the constant current sources 3 or 6. Therefore, it is possible to achieve a sufficient performance even if the voltage of the power terminal is low.

Figure 3:
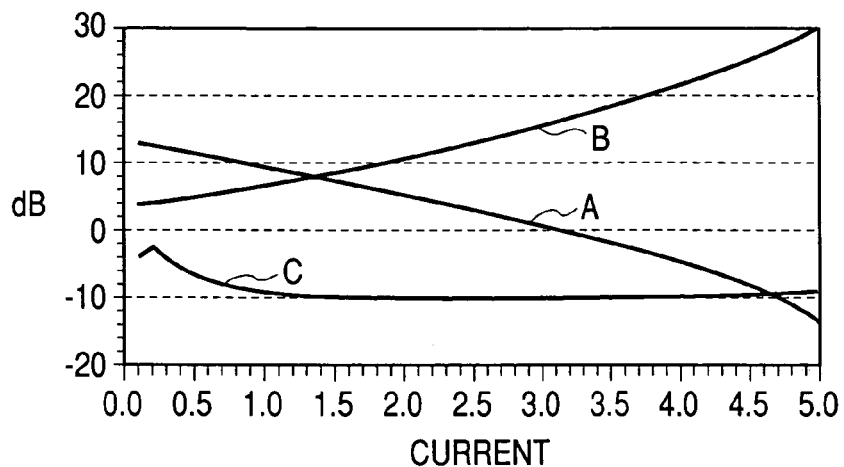
FIG. 3 illustrates characteristics of the variable gain amplifier, wherein the transistors are of equal chip size.
Figure 4:
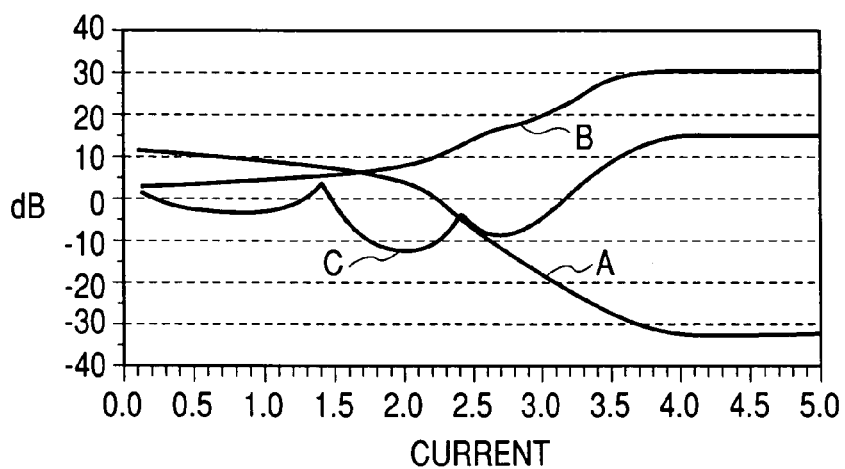
FIG. 4 illustrates characteristics of the variable gain amplifier, wherein the chip size of the third and fourth transistors is ½ of the chip size of the first and second transistors.
Figure 5:
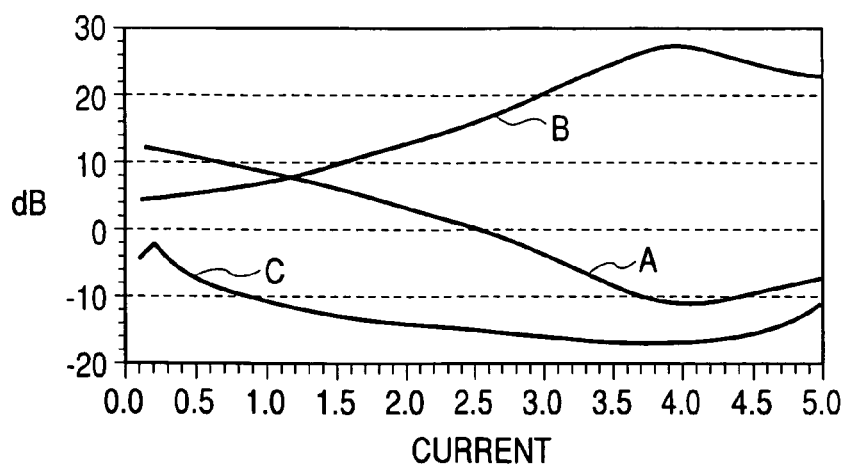
FIG. 5 illustrates characteristics of the variable gain amplifier, wherein the chip size of the third and fourth transistors is twice the chip size of the first and second transistors.
Figure 6:
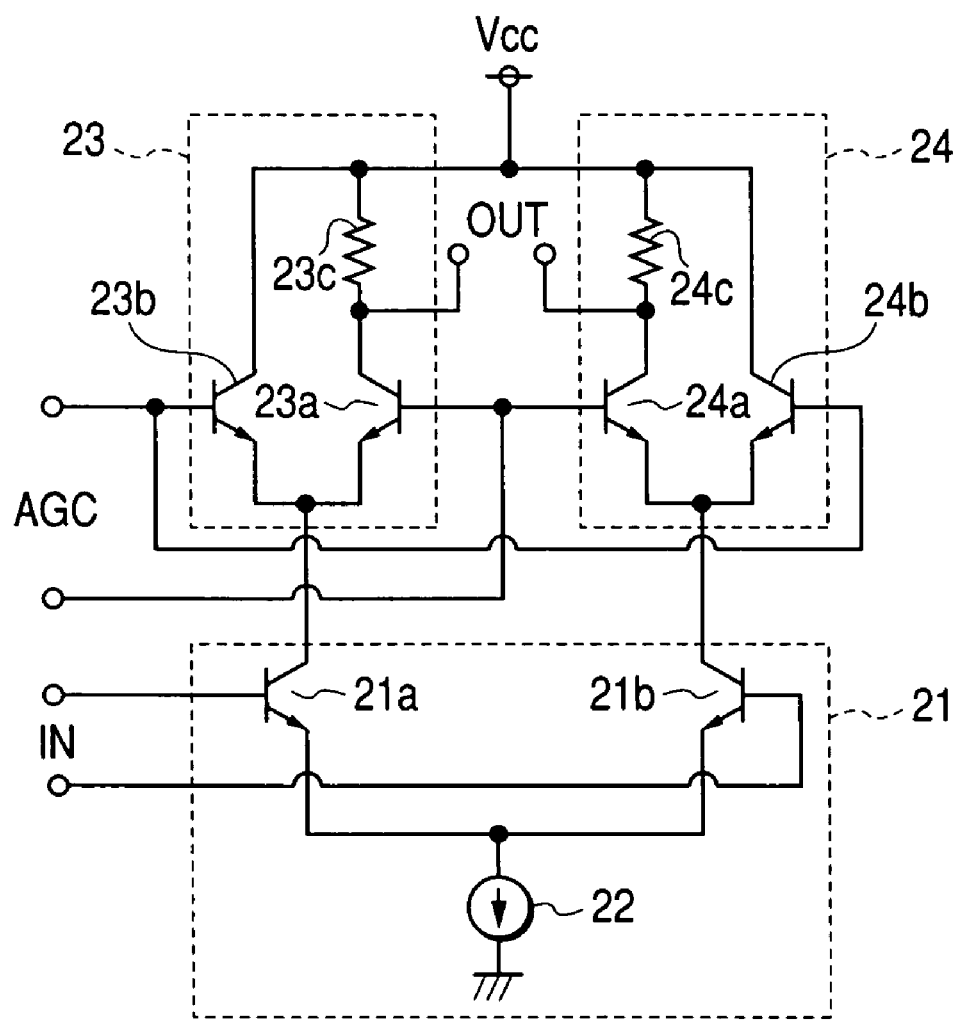
FIG. 6 is a circuit diagram illustrating a structure of the variable gain amplifier according to the prior art.

The first to fourth transistors 1, 2, 4, and 5 may be constructed in an integrated circuit. The chip size of the third and fourth transistors 4 and 5 is smaller than that of the first and second transistors 1 and 2. FIGS. 3 to 5 illustrate various performance characteristics such as gain, noise figure (NF), and distortion with respect to the current value (in mA) of the second constant current source 6 of the variable gain control. In FIGS. 3 to 5, A, B, and C denote the gain, the NF, and a distortion characteristic, respectively. The distortion characteristic is represented by an intercept point. FIG. 3 illustrates various characteristics in a case where the first to fourth transistors 1, 2, 4, and 5 have the same chip size. FIG. 4 illustrates various characteristics in a case where the chip size of the third and fourth transistors 4 and 5 is ½ of the chip size of the first and second transistors 1 and 2. FIG. 5 illustrates various characteristics in a case where the chip size of the third and fourth transistors 4 and 5 is twice the chip size of the first and second transistors 1 and 2. One means of achieving this chip size is to connect two transistor chips in parallel.

In FIG. 3, the distortion characteristic C is maintained as about −10 dBm over a wide range of the current value of the second constant current source 6. However, in FIG. 5 where the chip size of the third and fourth transistors 4 and 5 is twice the size of the example in FIG. 3, the intercept point is reduced (is deteriorated) to no more than −15 dBm over a wide range of the current value of the second constant current source 6. In FIG. 4 where the chip size of the third and fourth transistors 4 and 5 is ½ that of the example if FIG. 3, the distortion characteristic is no less than −10 dBm. In particular, when the current value is increased to no less than 3.5 mA to thus reducing the gain, the intercept point increases to no less than +10 dBm thus improving the distortion characteristic. Feedback resistors (not numbered)

may be inserted between the emitter of the third transistor 4 and the second constant current source 6, and between the emitter of the fourth transistor 5 and the second constant current source 6, respectively, to change the curve of the attenuation characteristic. Independent constant current sources (two second constant current sources) may be connected to the emitter of the third transistor 4 and to the emitter of the fourth transistor 5, and the emitter of the third transistor 4 and the emitter of the fourth transistor 5 may be connected to each other by a feedback resistor (not shown).

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A variable gain amplifier comprising:
   first and second transistors differentially connected to each other and having emitters connected to a first constant current source; and
   third and fourth transistors differentially connected to each other and having emitters connected to a second constant current source,
   wherein collectors of the first and fourth transistors are connected to a power terminal through a common first load resistor,
   wherein collectors of the second and third transistors are connected to the power terminal through a common second load resistor,
   wherein a high frequency signal is input between bases of the first and third transistors and bases of the second and fourth transistors, and
   wherein current of the second constant current source is variable in a range no more than the current value of the first constant current source.

2. The variable gain amplifier according to claim 1, wherein the second constant current source comprises:
   a fifth transistor having a collector connected to the emitters of the third and fourth transistors and an emitter which is grounded;
   a sixth transistor having a base and a collector which are connected to each other and to a base of the fifth transistor, wherein the collector is connected to the power terminal by a resistor; and
   a seventh transistor having a grounded emitter, and a collector connected to the emitter of the sixth transistor, wherein a gain control voltage is applied to a base of the seventh transistor.

3. The variable gain amplifier according to claim 1, wherein at least the first, second, third and fourth transistors are constructed in an integrated circuit, and
   wherein the chip size of the third and fourth transistors is smaller than that of the first and second transistors.

4. The variable gain amplifier of claim 1, wherein resistors are inserted between the emitter of the third transistor and the second constant current source, and between the emitter of the fourth transistor and the second constant current source.

5. The variable gain amplifier of claim 1, wherein the second constant current source is comprised of third and fourth constant current source, the third constant current source connected to the emitter of the third transistor and the fourth constant current source connected to the emitter of the fourth transistor, and the emitters of the third an fourth transistors connected by a resistor.

6. A variable gain amplifier, comprising:
   a first and a second cross connected-transistor differential amplifier;
   a fixed constant current source; and
   a variable constant current source,
   wherein collectors of the first differential amplifier and collectors of the second differential amplifier are connected to a power terminal by common load resistors, and emitters of the first differential amplifier are connected to the fixed constant current source and emitters of the second differential amplifier are connected to the variable constant current source.

7. The variable gain amplifier according to claim 6, wherein the variable constant current source comprises:
   a first transistor having a collector connected to the emitters of the second differential amplifier and an emitter which is grounded;
   a second transistor having a base and a collector which are connected to each other and to the base of the first transistor, wherein the collector is connected to the power terminal by a resistor; and
   a third transistor having a collector connected to the emitter of the second transistor and a grounded emitter, wherein a gain control voltage is applied to the base of the third transistor.

8. The variable gain amplifier according to claim 6, wherein at least the differential amplifiers are constructed in an integrated circuit, and
   wherein a chip size of the transistors of the second differential amplifier is smaller than a chip size of the transistors of the first differential amplifier.

9. A variable gain amplifier, comprising:
   an even number of differential transistor amplifiers;
   a fixed constant current source; and,
   a variable constant current source,
   wherein, inputs of the differential transistor amplifiers are connected in parallel, and collectors of the even numbered amplifiers and collectors of odd numbered amplifiers are cross-connected through common load resistors to a power supply terminal, emitters of even numbered amplifiers being connected to the fixed constant current source, and emitters of odd numbered amplifiers being connected to the variable constant current source.

* * * * *

UNITED STATES PATENT AND TRADEMARK OFFICE
CERTIFICATE OF CORRECTION

| | |
|---|---|
| PATENT NO. | : 7,138,867 B2 |
| APPLICATION NO. | : 10/913612 |
| DATED | : November 21, 2006 |
| INVENTOR(S) | : Takeo Suzuki et al. |

It is certified that error appears in the above-identified patent and that said Letters Patent is hereby corrected as shown below:

In the Claims

Column 6, in claim 5, line 9, after "the emitters of the third" delete "an" and substitute --and-- in its place.

Signed and Sealed this

Seventeenth Day of April, 2007

JON W. DUDAS
*Director of the United States Patent and Trademark Office*